United States Patent
Leuenberger et al.

(12)

(10) Patent No.: US 6,420,207 B1
(45) Date of Patent: Jul. 16, 2002

(54) SEMICONDUCTOR PACKAGE AND ENHANCED FBG MANUFACTURING

(75) Inventors: Eduard Raymond Leuenberger, Sai Kung; Dennis Lau Cheuk-Ping, Fanling, both of (HK)

(73) Assignee: Multek Hong Kong Limited, Hong Kong (KR)

(*) Notice: Subject to any disclaimer, the term of this patent is extended or adjusted under 35 U.S.C. 154(b) by 0 days.

(21) Appl. No.: 09/477,350

(22) Filed: Jan. 4, 2000

(51) Int. Cl.[7] .............................................. H01L 21/44
(52) U.S. Cl. ...................... 438/106; 438/127; 257/678; 257/692; 257/693; 257/701; 29/831; 29/840; 361/761; 361/762; 361/795; 361/707
(58) Field of Search ................................ 438/106, 613; 257/678, 692, 693, 701; 29/831, 840; 361/761, 762, 795, 707

(56) References Cited

U.S. PATENT DOCUMENTS

| | | | |
|---|---|---|---|
| 5,017,267 A | | 5/1991 | Cordani |
| 5,075,965 A | * | 12/1991 | Carey et al. ................. 29/840 |
| 5,446,625 A | | 8/1995 | Urbish et al. |
| 5,632,438 A | | 5/1997 | Hoffmeyer et al. |
| 5,679,977 A | * | 10/1997 | Khandros et al. ............ 257/692 |
| 5,724,232 A | * | 3/1998 | Bhatt et al. .................. 361/762 |
| 5,859,110 A | | 1/1999 | Iwamoto et al. |
| 5,935,640 A | | 8/1999 | Ferrier et al. |
| 5,942,795 A | * | 8/1999 | Hoang ......................... 257/692 |
| 5,950,304 A | * | 9/1999 | Khandros et al. ............. 29/831 |
| 6,038,137 A | * | 3/2000 | Bhatt et al. .................. 361/795 |
| 6,043,985 A | * | 3/2000 | Azdashi et al. .............. 361/707 |

* cited by examiner

Primary Examiner—Matthew Smith
Assistant Examiner—Belur V. Keshavan
(74) Attorney, Agent, or Firm—Sterne Kessler Goldstein & Fox

(57) ABSTRACT

A high density, non-bussed semiconductor package and a full body gold (FBG) method for manufacturing semiconductor packages are provided to improve electrical and mechanical connections with semiconductors and other electronic components and devices. The semiconductor package is fabricated by developing circuitry on the wire bond side of the semiconductor package prior to developing the ball attach side. The copper circuitry on the wire bond side is fully covered and protected from the environment. Solder masks are applied directly to the semiconductor substrate or copper layer to avoid contact with gold. The ball attach area is covered and protected by metallic layers, such as nickel and gold, or an organic solderable material to eliminate weak solder mask-gold connections.

10 Claims, 10 Drawing Sheets

SEMICONDUCTOR PACKAGE AND ENHANCED FBG MANUFACTURING

BACKGROUND OF THE INVENTION

1. Field of the Invention

The present invention relates generally to hybrid electronics, and more particularly, to improving electrical and mechanical connectivity to semiconductor packages.

2. Related Art

Semiconductor packages are known by a variety of generic names, such as ball grid arrays (BGA), plastic ball grid arrays (PBGA), multi chip module-laminates (MCM-L), and packaging substrates. Semiconductor packages can be composed of any one of a variety of materials, such as bismaldehyde trizaine resins, multifunctional epoxy resins, polyamide systems, and a range of other materials. The base materials used to manufacture the substrate, also referred to as a laminate, are usually a combination of resin systems and woven fiberglass.

A semiconductor package typically is manufactured by taking a substrate and depositing a metallization layer to develop circuitry for a wire bond area on one side and circuitry for a ball attach area on the opposite side of the substrate. Solder masks can be applied to provide mechanical and electrical support, and a via hole or through hole connects the wire bond circuitry to the ball attach circuitry.

Semiconductor packages serve as a mounting device for semiconductors. When a semiconductor is mounted on a semiconductor package, the semiconductor is usually a bare die. However, in certain instances, the bare die may be housed in some type of subassembly, which is in turn attached to the semiconductor package.

Semiconductor packages are actually interposers, which lie between the semiconductor and a larger printed circuit board. The function of the interposers is to serve as a "fan out" for the very high-density electrical outputs from the semiconductor. The interposer transitions the very high density electrical output from the semiconductor into a less dense output that is suitable for mounting an assembled packaging substrate (i.e., semiconductor package and semiconductor die) to the printed circuit board.

Today three major trends influence the electronics industry: an ever-increasing number of outputs from the semiconductor, miniaturization of all electronic components (especially semiconductor die and packaging substrates), and portability. As a result, these trends are forcing semiconductor packages to become smaller, which in turn requires circuit lines to become smaller, spaces between the circuit lines to become closer, and via holes connecting one side of the semiconductor package to the other to become smaller.

Depending on the number of output connections from the die, the final package size actually becomes larger because the routing of circuitry forces the semiconductor package to become denser. For instance, each input/output port (I/O) on the semiconductor die has to be connected to a circuit net on the wire bond area of the semiconductor package. Each circuit net on the semiconductor package is routed to a via hole to make the connection with the backside (ball attach side of the package). The ball attach area is attached to the printed circuit board. Thus, as circuit density increases, a limiting factor in package design is the size of the via hole and the size of the pad that surrounds the via hole. The area of the finished package is directly proportional to the number of I/Os on the semiconductor die and directly proportional to the area occupied on the printed circuit board. This high-density design makes it physically impossible to include an additional bus line for the electrical connection during electro plating between two bond fingers.

Due to the high-density design, semiconductor packages are generally manufactured by using a full body gold (FBG) process whereas, nickel and gold layers are the etch resist in the subsequent etching away of a copper layer. The circuitry is developed on both sides of the semiconductor package at the same time, resulting in the wire bond area having nickel and gold overhangs that expose the copper layer to the environment. As a result, the exposed copper can diffuse or oxidize, thus deteriorating the conductivity of the wire bond area. A gold layer is typically applied to both sides of the semiconductor package, and a solder mask is deposed directly onto the gold layer. However, solder mask-gold connections typically have poor adhesion. As can be seen, FBG manufacturing processes have several inherent weaknesses.

What is needed is a method for manufacturing semiconductor packages that overcomes the problems of FBG or other unreliable electrolysis processes.

SUMMARY OF THE INVENTION

The present invention is directed to high density, non-bussed semiconductor packages and a full body gold (FBG) method for manufacturing the semiconductor packages. According to an embodiment of the present invention, the semiconductor package is fabricated by developing circuitry on the wire bond side of the semiconductor package prior to developing the ball attach side. The copper circuitry on the wire bond side is fully covered by nickel and gold layers. Solder masks are applied directly to the substrate or copper layer to avoid contact with gold. In one embodiment of the present invention, nickel and gold layers cover the ball attach area. In another embodiment, the ball attach area is protected by an organic solderable material.

An advantage of the present invention is the fabrication of a semiconductor device that eliminates solder mask-gold connections. Since the presence of gold tend to weaken solder joints, avoiding such connections strengthens the electrical and mechanical connections to the semiconductor package.

Another advantage of the present invention is having a fully encapsulated wire bond area. Since the copper circuitry is fully covered by one or more layer of other material, it is protected from the environment, which reduces diffusion and oxidation.

Further features and advantages of the present invention, as well as the structure and operation of various embodiments of the present invention, are described in detail below with reference to the accompanying drawings.

BRIEF DESCRIPTION OF THE FIGURES

The present invention is described with reference to the accompanying drawings. In the drawings, like reference numbers indicate identical or functionally similar elements.

DETAILED DESCRIPTION OF THE PREFERRED EMBODIMENTS

I. Overview

Figure 1A:
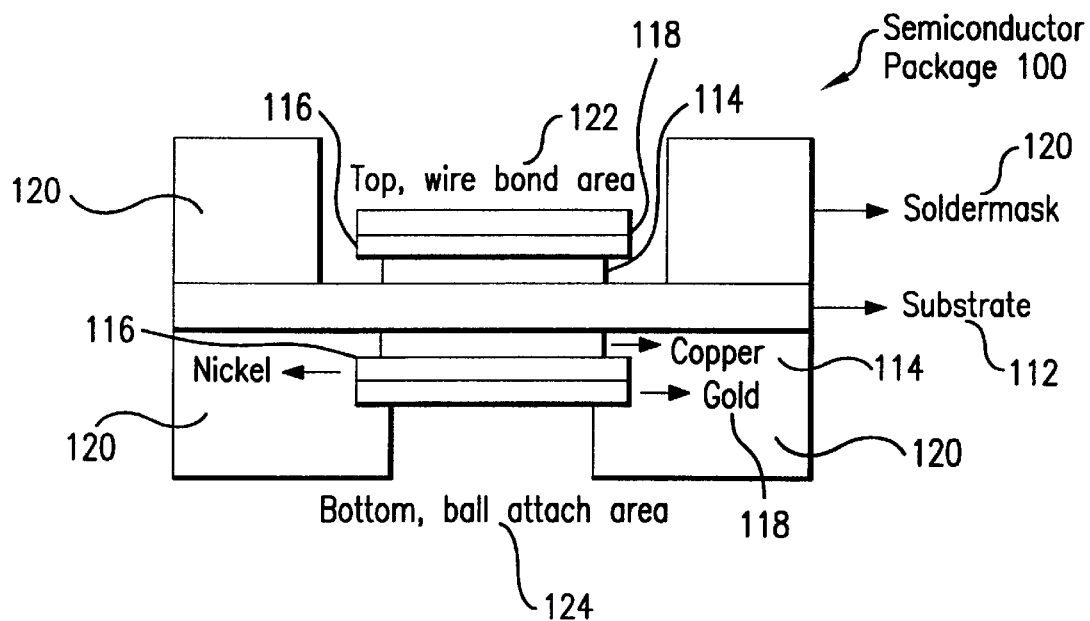
FIG. 1a illustrates a side-view of a semiconductor package.
Figure 1B:
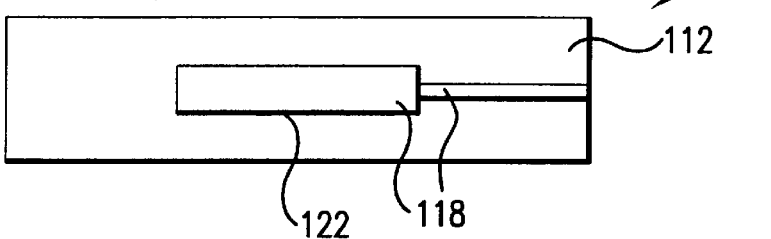
FIG. 1b illustrates the top-view of the semiconductor package of FIG. 1a, without solder masks.
Figure 1C:
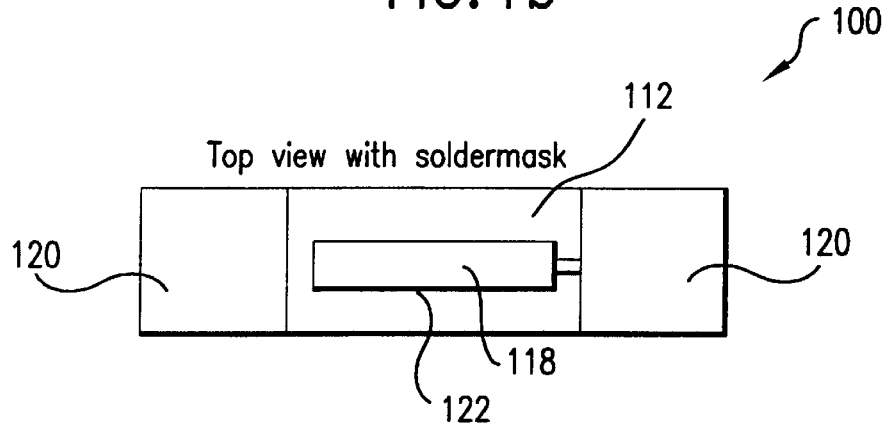
FIG. 1c illustrates the top-view of the semiconductor package of FIG. 1a, including solder masks.
Figure 1D:
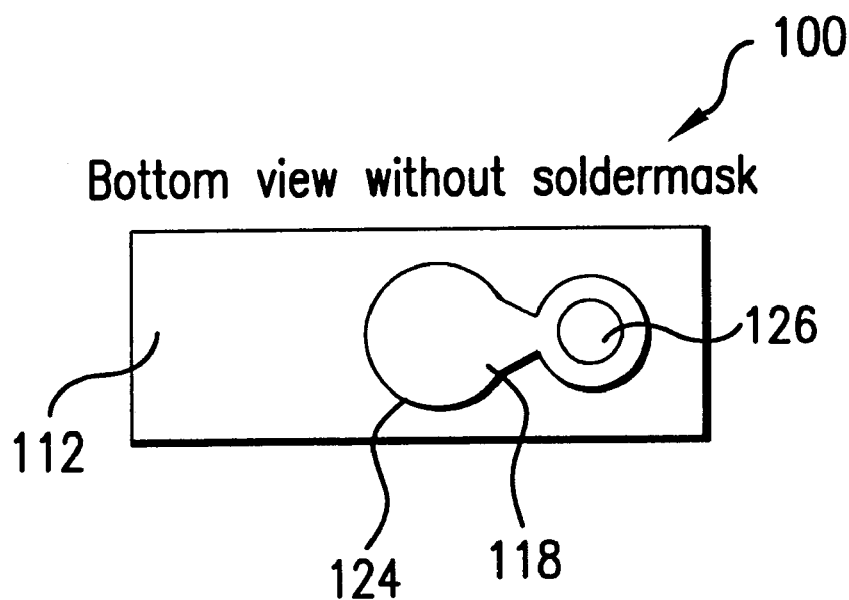
FIG. 1d illustrates the bottom-view of the semiconductor package of FIG. 1a, without solder masks.
Figure 1E:
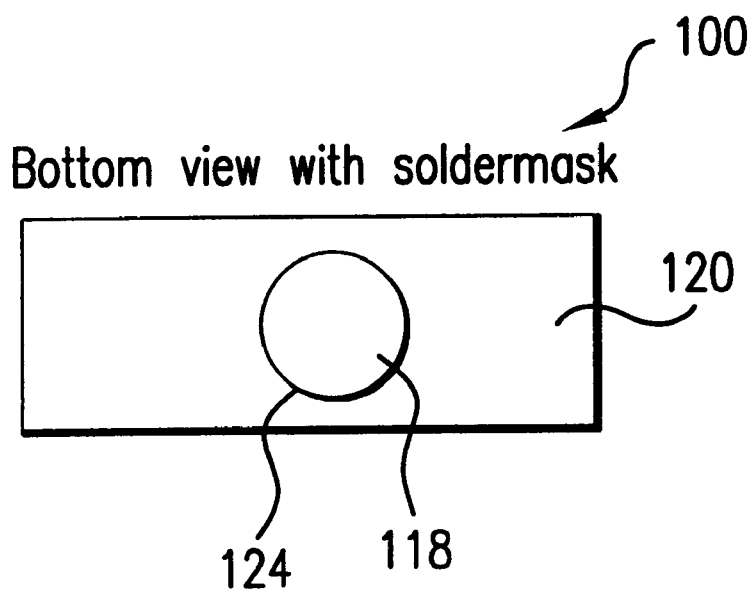
FIG. 1e illustrates the bottom-view of the semiconductor package of FIG. 1a, including solder masks.

The present invention relates to the manufacture of semiconductor packages. FIGS. 1a–1e illustrate five distinct views of a semiconductor package 100. Referring to FIG. 1a, semiconductor package 100 can be fabricated by depositing layers of copper 114, nickel 116 and gold 118 onto a substrate 112 to develop circuitry for a wire bond area 122 (also referred to herein as the wire bond side) and a ball attach area 124 (also referred to herein as the ball attach side). As shown in FIG. 1a, a solder mask 120 can also be applied to provide mechanical and electrical support to substrate 112. Referring to FIG. 1d, a via hole or through hole 126 connects the wire bond circuitry to the ball attach circuitry.

Figure 2:
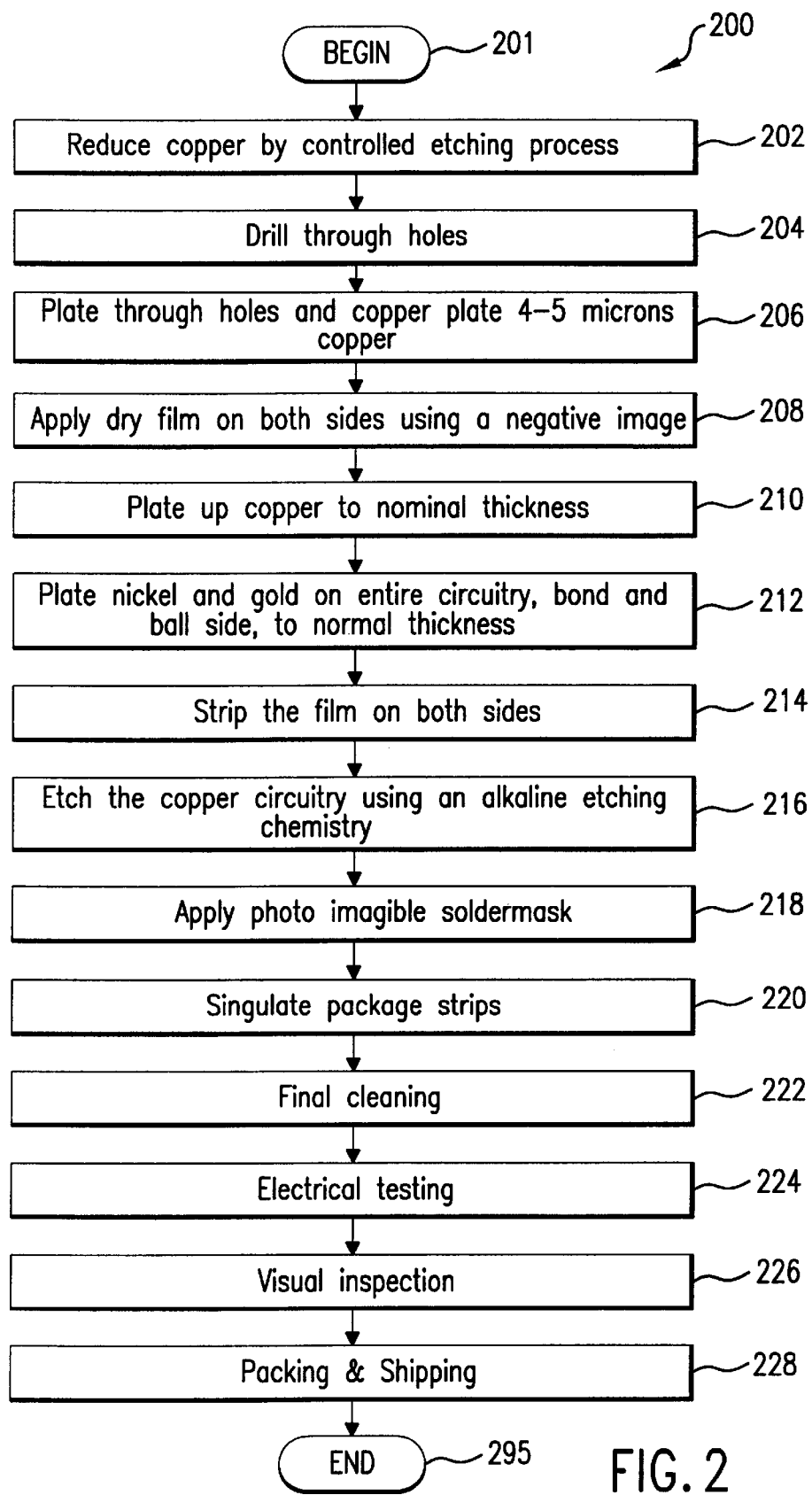
FIG. 2 illustrates a block diagram of a method for manufacturing a semiconductor package.

High density semiconductor packages can be manufactured by using a full body gold (FBG) process. Referring to FIG. 2, flowchart 200 represents the general operational flow of a process for manufacturing the semiconductor package of FIGS. 1a–1e. FIG. 2 begins at step 201. At step 202, the copper layer on the substrate 112 is reduced by a controlled etching process. At step 204, the through or via hole 126 is drilled through substrate 112, and at step 206, the via hole 126 and substrate 112 is copper plated to, for example, four to five microns. Referring to steps 208–218, the circuitry is developed on both sides of semiconductor package 100 at the same time. As shown in FIG. 1a, this technique results in the wire bond area 122 having nickel 116 and gold 118 overhangs that expose the copper layer 114 to the environment. As a result, the exposed copper 114 can diffuse or oxidize, thus deteriorating the conductivity of the wire bond area 122. In steps 212–218, the gold 118 is applied to both sides of the semiconductor package, and the solder mask 120 is deposed directly onto the gold 118 layer. Since solder mask and gold typically form weak connections and provide poor adhesion, these joints are very brittle and provides poor adhesion.

The present invention overcomes these problems by providing a manufacturing process that protects the copper circuitry and avoids the use of solder mask-gold connections. In particular, the multiple embodiments of the present invention develop the wire bond side of the semiconductor package prior to developing the ball attach side, and maintain electrical continuity with the copper surface of the ball attach side while forming the circuitry on the wire bond side. The present invention provides for the copper layer to be fully covered and protected by one or more layers of other material to improve the conductivity of the wire bond area. The present invention also applies gold only to the bond area as compared to the entire copper surface area representing a savings in precious metals. In the present invention, the solder masks are applied over copper, instead of gold, to strengthen the adhesive layer between the solder mask and the copper.

II. Nickel-Gold Surface Finish on Ball Attach Side

Figure 3A:
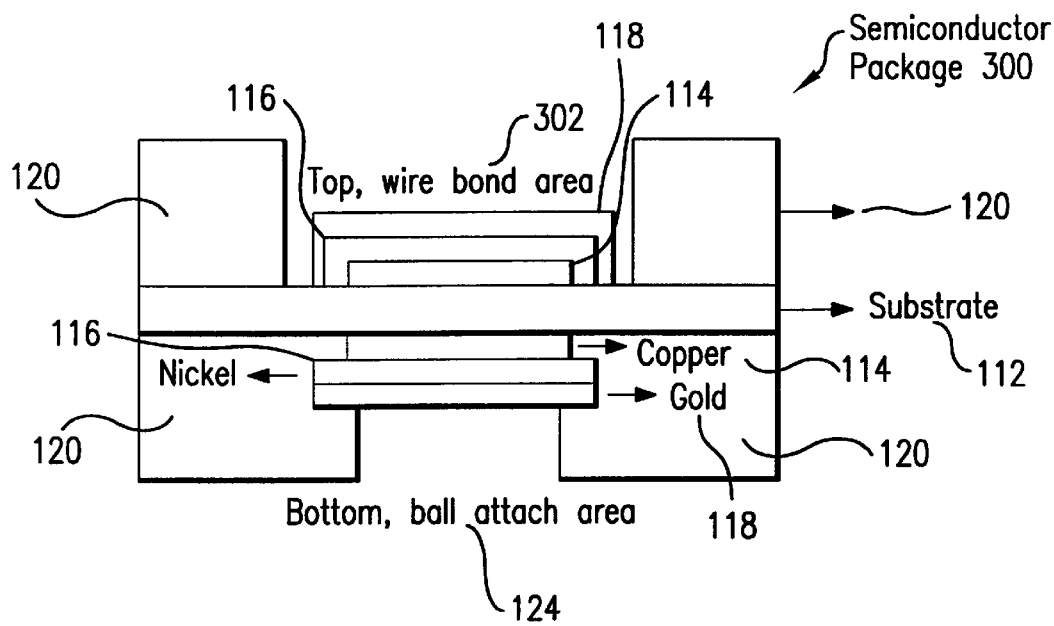
FIG. 3a illustrates a side-view of a semiconductor package, formed in accordance with one embodiment of the present invention.
Figure 3B:
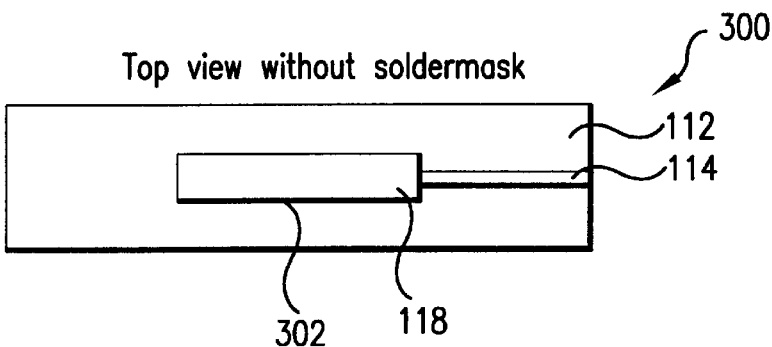
FIG. 3b illustrates the top-view of the semiconductor package of FIG. 3a, without solder masks.
Figure 3C:
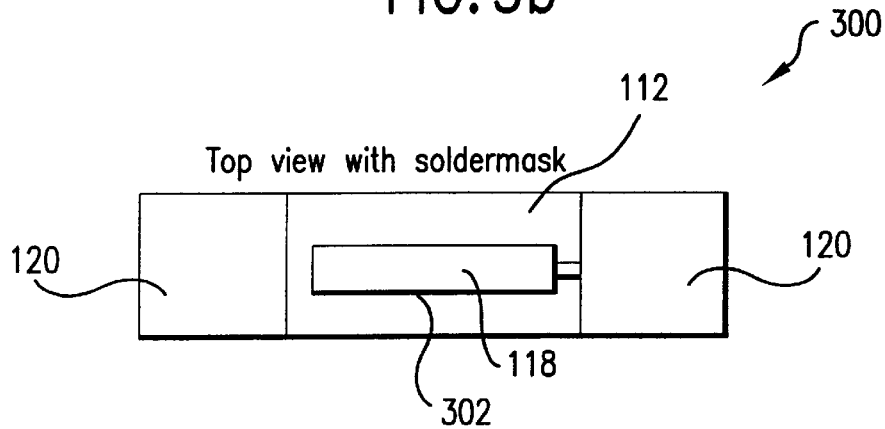
FIG. 3c illustrates the top-view of the semiconductor package of FIG. 3a, including solder masks.
Figure 3D:
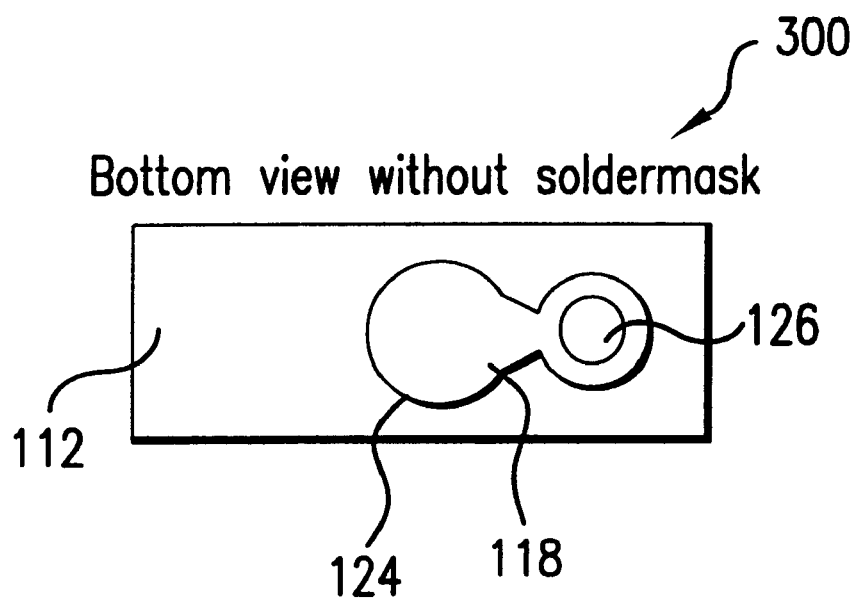
FIG. 3d illustrates the bottom-view of the semiconductor package of FIG. 3a, without solder masks.
Figure 3E:
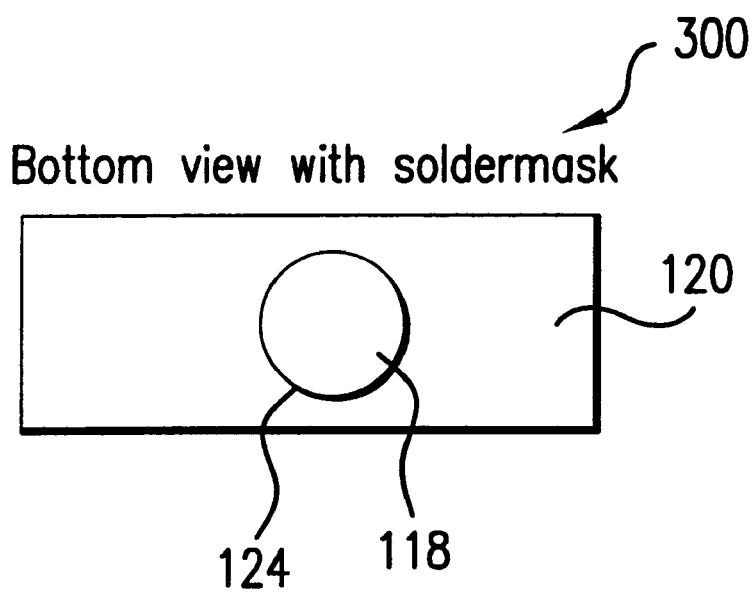
FIG. 3e illustrates the bottom-view of the semiconductor package of FIG. 3a, including solder masks.

FIGS. 3a–3e illustrate multiple views of semiconductor package 300 manufactured by one embodiment of the present invention. Referring to FIG. 3a, semiconductor package 300 includes several layers of metals, such as copper 114, nickel 116 and gold 118, on substrate 112, with circuitry developed for wire bond area 302 (also referred to herein as the wire bond side) and ball attach area 124 (also referred to herein as the ball attach side). As shown in FIG. 3a, solder mask 120 can also be applied to provide mechanical and electrical support to substrate 112. Referring to FIG. 3d, via hole or through hole 126 connects the wire bond circuitry to the ball attach circuitry.

Figure 4A:
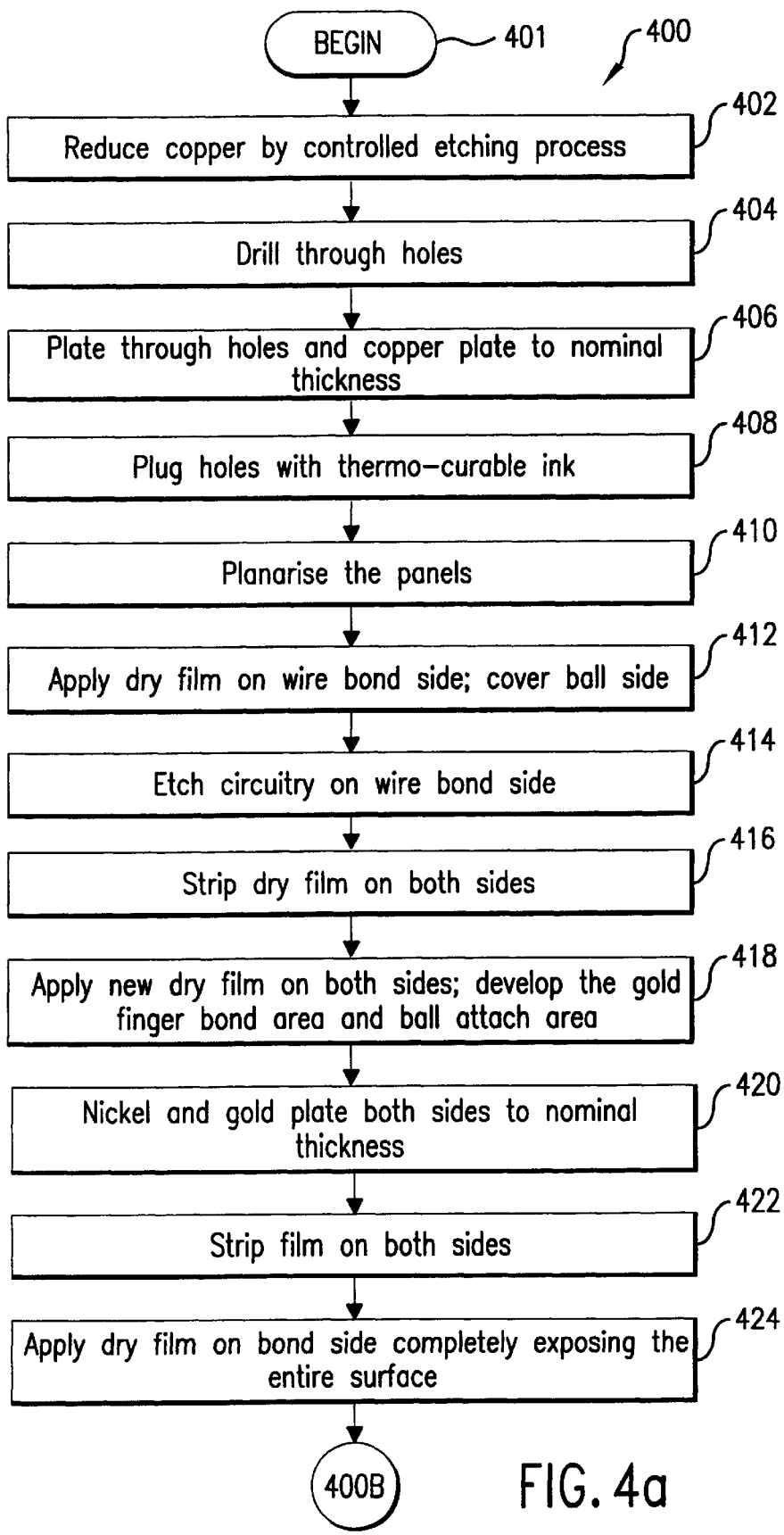
FIGS. 4a–4b illustrates a block diagram of a method for manufacturing a semiconductor package in accordance with one embodiment of the present invention.
Figure 4B:
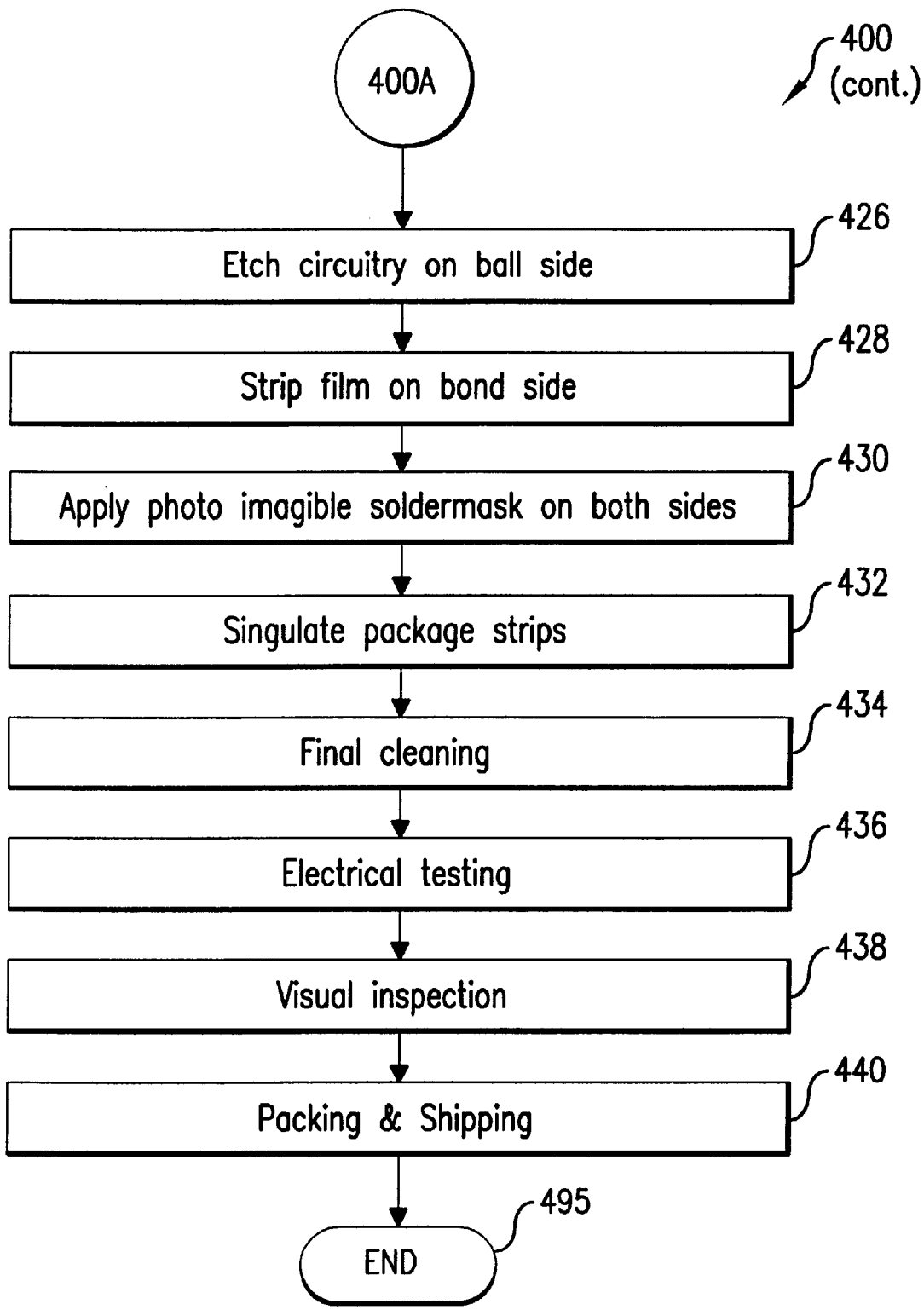

Referring to FIGS. 4a–4b, flowchart 400 represents the general operational flow of an embodiment of the present invention. More specifically, flowchart 400 shows an example of a process for manufacturing the semiconductor package of FIGS. 3a–3e.

FIGS. 4a–4b begin at step 401. At step 402, the copper is reduced from 17 micro-meters ($\mu$m) to 5 $\mu$m by a controlled etching process. Next, at step 404, via hole(s) 126 is mechanically drilled through substrate 112. At step 406, via hole(s) 126 and substrate 112 are copper plated to nominal thickness. Via hole(s) 126 is plugged with a thermo-curable ink at step 408. Step 410 planarises the panels, removes the protruding ink and creates a uniform surface topography. Steps 408 and 410 differ significantly from the process shown in FIG. 2, where via hole 126 is filled by solder mask 120 at step 218 after the circuitry is etched on both sides of semiconductor package 100. In the present invention, the via hole is filled before the circuitry is etched on either side. It is important to fill via hole 126 to prevent the dry film from breaking, while developing the circuitry in the subsequent process steps.

The present invention provides another significant improvement over FBG processes by developing the wire bond 302 and ball attach 124 sides separately. The wire bond 302 side is developed first, while maintaining electrical continuity with the copper surface on the ball attach 124 side. The exposed copper on the ball attach 124 side maintains the electrical continuity needed to deposit the nickel and gold. For instance, at step 412, dry film is applied on the wire bond 302 side using a positive image, and the ball attach 124 side is covered with fully exposed dry film.

At step 414, the circuitry is etched on wire bond 302 side with an acidic cupric etchant or the like, as would be apparent to a person skilled in the relevant art(s). Using film as an etch resist on the wire bond 302 side allows finer lines and spaces and reads higher density. The process shown in FIG. 2 has a much stronger effect of underetch due to the presence of galvanic elements during the etching (i.e., Cu—Ni—Au interface).

At step 416, the dry film is stripped on both sides of the panel. At step 418, new dry film is applied on both sides. On the wire bond side, the gold finger or wire bond area 302 is developed, and on the ball side, the solder ball attach area 124 is developed. At step 420, both sides are nickel and gold plated to nominal thickness. After this step, the top and sides of wire bond area 302 are fully covered with nickel 116 and gold 118 as compared to leaving a nickel and gold overhang as discussed above in regards to FIG. 1a. In the present invention, on the wire bond side, the gold is only applied to the wire bond area 302 as compared to the entire copper surface as illustrated in FIG. 1b for semiconductor package 100. This produces a substantial savings in precious metal cost.

At step 422, the film is stripped on both sides, and at step 424, dry film is applied on the wire bond 302 side completely exposing the entire dry film surface with UV light. At step 426, the circuitry is etched on ball attach 124 side using an alkaline etching solution. At step 428, the film is stripped on the wire bond 302 side. At step 430, a photo imagible solder mask 120 is applied on both sides. At step 432, the package strips are singulated by routing or stamping. Steps 434–440 provide for final cleaning, electrical testing, visual inspection and packing and shipping of the strips, or the like, as would be apparent to a person skilled in the relevant art(s). The control flow of flowchart 400 then ends as indicated by step 495.

In this embodiment of the present invention, solder mask 120 is applied to the copper layer 114 on the wire bond 302 side. This solder over copper technique provides better adhesion than applying the solder mask 120 directly to gold, which produces a more brittle connection. The solder mask over copper technique has the potential of passing the Joint Electron Device Engineering Council (JEDEC) level II requirements. However, on the ball attach side, solder mask 120 is deposited on gold layer 118.

III. Organic Solderable Protection Finish on the Ball Attach Side

In another embodiment, the present invention relates to manufacturing a semiconductor package by applying solder masks over copper, in lieu of gold, on both sides of the semiconductor package. The copper is protected from environmental exposure by depositing a layer of an organic solderable protection (OSP) material over the copper on the ball attach side. FIGS. 5a–5e illustrate multiple views of semiconductor package 500 manufactured by one embodiment of the present invention.

Figure 5A:
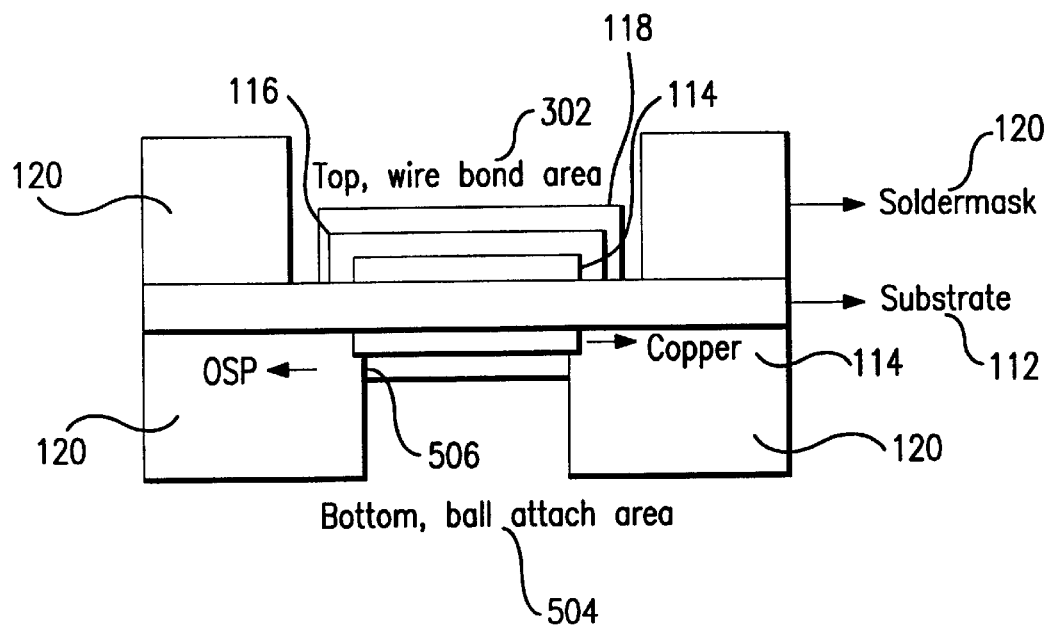
FIG. 5a illustrates a side-view of a semiconductor package, formed in accordance with a second embodiment of the present invention.
Figure 5B:
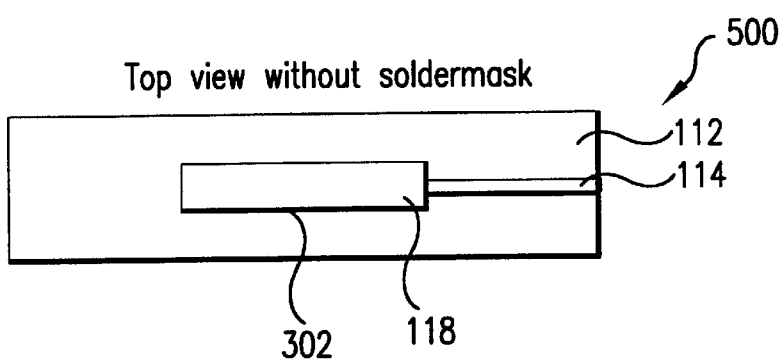
FIG. 5b illustrates the top-view of the semiconductor package of FIG. 5a, without solder masks.
Figure 5C:
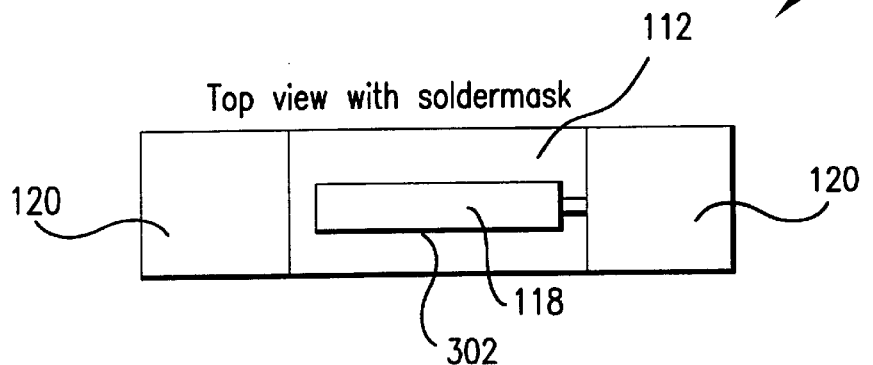
FIG. 5c illustrates the top-view of the semiconductor package of FIG. 5a, including solder masks.
Figure 5D:
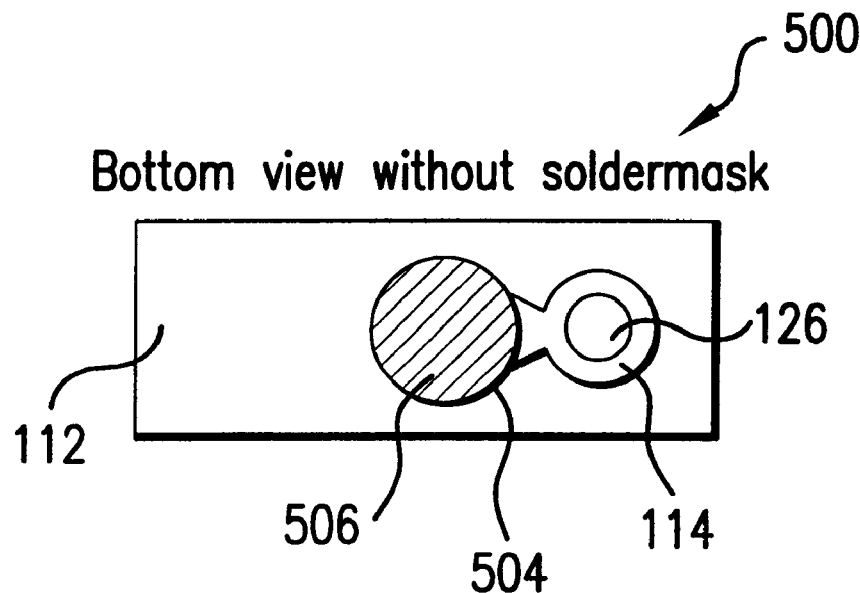
FIG. 5d illustrates the bottom-view of the semiconductor package of FIG. 5a, without solder masks.
Figure 5E:
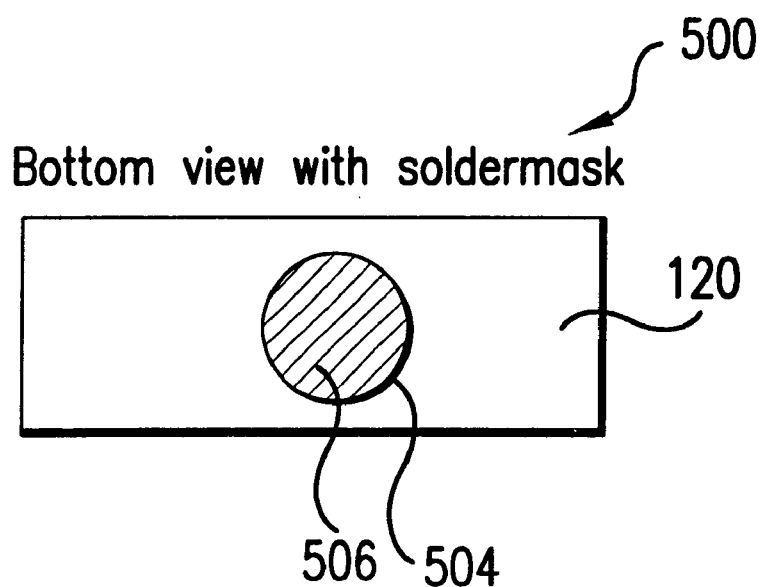
FIG. 5e illustrates the bottom-view of the semiconductor package of FIG. 5a, including solder masks.

Referring to FIG. 5a, semiconductor package 500 includes several layers of copper 114, nickel 116 and gold 118 on substrate 112, with circuitry developed for wire bond area 302 (also referred to herein as the wire bond side) and ball attach area 504 (also referred to herein as the ball attach side). As shown in FIG. 5a, solder mask 120 can also be applied to provide mechanical and electrical support to substrate 112. Referring to FIG. 5d, via hole or through hole 126 connects the wire bond circuitry to the ball attach circuitry. FIG. 5e shows a layer of an organic solderable protectant (OSP) 506 can be applied to the ball attach 504 side to protect the copper layer 114 from the environment.

Figure 6:
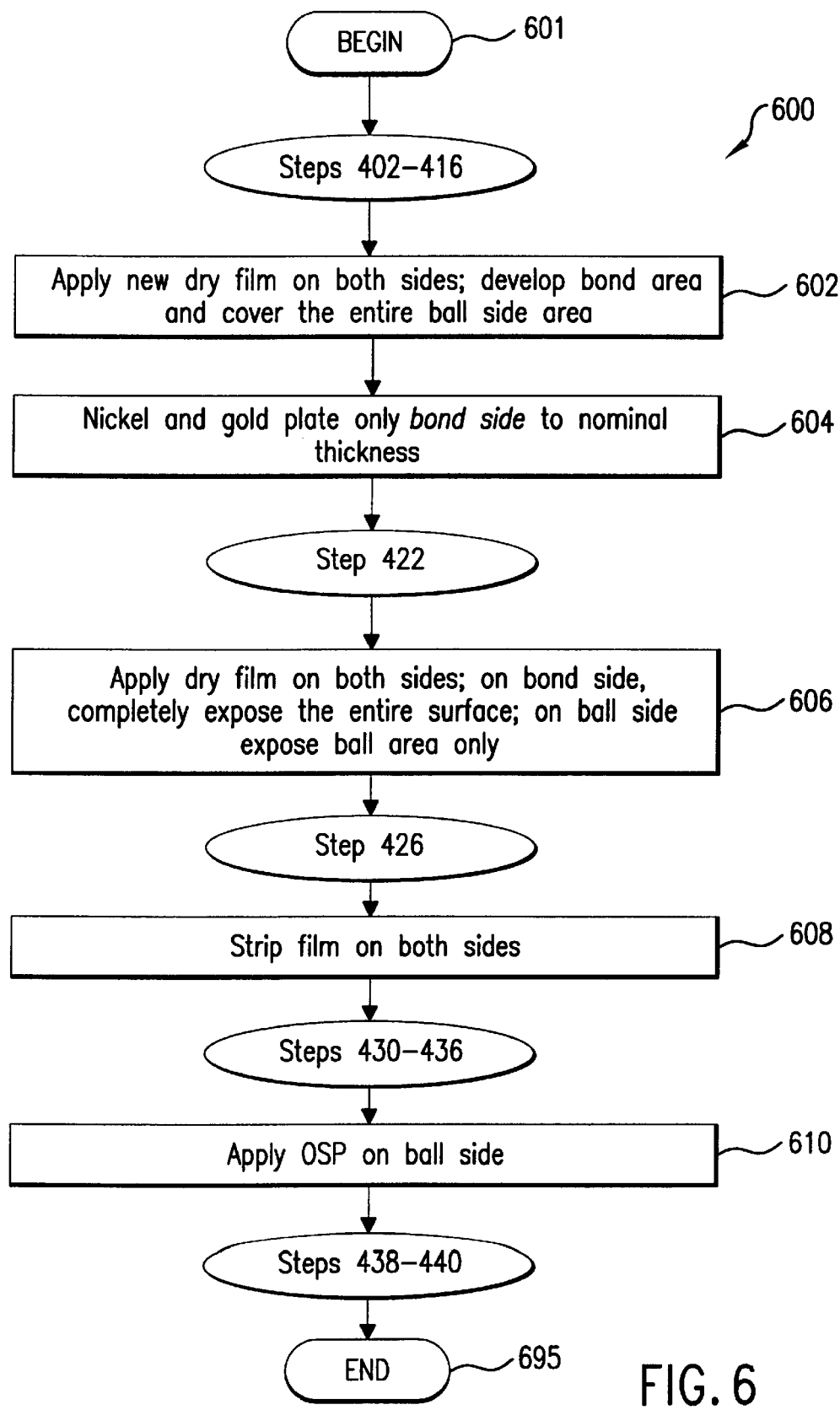
FIG. 6 illustrates a block diagram of a method for manufacturing a semiconductor package in accordance with a second embodiment of the present invention.

Referring to FIG. 6, flowchart 600 represents the general operational flow of an embodiment of the present invention. More specifically, flowchart 600 shows an example of a control flow for manufacturing the semiconductor package of FIGS. 5a–5e.

FIG. 6 begins at step 601. Steps 402–416 are identical to the process steps in control flow 400. After step 416, control flow 600 begins to differ significantly from the embodiment described in control flow 400. At this point, control flow 600, passes to step 602. At step 602, new dry film is applied on both sides of the substrate 112. Unlike step 418 in control flow 400, at step 602, a nickel and gold layer is only deposited on the wire bond 302 side; therefore, in step 602, only the gold finger or wire bond area 302 is developed. On the ball attach 504 side, the entire area is covered with exposed film. At step 604, the wire bond 302 side is nickel and gold plated to nominal thickness. After step 604, control flow 600 passes to step 422 as described in control flow 400.

After step 422, control flow 600 passes to step 606. At step 606, dry film is applied on both sides. The entire surface of the wire bond 302 side is completely exposed; however, on the ball attach side, only the ball attach area 504 is exposed. Control flow 600 then passes to step 426, where the circuitry is etched on the ball attach 504 side, as described in control flow 400. After step 426, control flow 600 passes to step 608. At step 608, the film is stripped on both sides.

Control flow 600 then passes to steps 430–436 as described in control flow 400. After electrical testing at step 436, the flow passes to step 610. At step 610, a monolayer of an organic solderable protectant (OSP) 506, such as Entek™ 56 which is available from Enthone-OMI, is applied to the ball attach 504 side to protect the exposed copper layer 114 from the environment. The OSP 506 is a transparent material making the copper layer 114 visible. The control flow then passes to steps 438–440, as described in reference to control flow 400. Afterwards, the control flow of flowchart 600 ends as indicated by step 695.

In this embodiment of the present invention, solder mask 120 is applied to the copper layer 114 on both sides of semiconductor package 500. This solder over copper technique provides better adhesion than applying the solder mask 120 directly to gold, which produces a more brittle connection. The solder mask over copper technique has the potential of passing the Joint Electron Device Engineering Council (JEDEC) level II requirements. On the ball attach 504 side, the copper layer 114 is covered and protected from the environment by OSP layer 506, and on the wire bond 302 side, the copper layer is covered and protected from the environment by the nickel 116 and gold 118 layers. As a result, the copper layer 114 is protected from diffusion and oxidation, which in turn improves the conductivity of the wire bond 302 and ball attach 504 areas.

IV. Conclusion

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. For example, semiconductor packages 300 and 500, and process flows 400 and 600 depict only two examples of a semiconductor package of the present invention. The semiconductor package can have multiple wire bond areas or ball attach areas. The metallization layers can include other metals or materials, or multiple layers of the same metals or materials. Thus, the present invention should not be limited by any of the above described exemplary embodiments, but should be defined only in accordance with the following claims and their equivalents.

What is claimed is:

1. A method for manufacturing a semiconductor package having a wire bond side and a ball attach side, comprising the steps of:

(1) forming layers of several metals including copper, nickel and gold to develop a wire bond area on the wire bond side, wherein said copper layer is formed directly over a laminate representing the base of the semiconductor package and the top and side surfaces of said copper layer are fully covered by said other metallic layers;

(2) forming layers of several metals including copper, nickel and gold to develop a ball attach area on the ball attach side, wherein said gold layer is the outer surface layer, and wherein step (1) occurs before step (2); and (3) applying a photo imagible solder mask on at least one of the wire bond side and ball attach side.

2. A method of claim 1, further comprising the steps of:

(4) drilling at least one via hole through said laminate; and (5) plugging said at least one via hole with a thermo-curable ink.

3. A method of claim 2, wherein step (5) occurs before step (1).

4. A method of claim 1, wherein said step (1) further comprises the step of etching circuitry on the wire bond side by using an acidic cupric etchant.

5. A method for manufacturing a semiconductor package having a wire bond side and a ball attach side, comprising the steps of:

(1) forming layers of several metals including copper, nickel and gold to develop a wire bond area on the wire bond side, wherein said copper layer is formed over a laminate representing the base of the semiconductor package and the top and side surfaces of said copper layer are fully covered by said other metallic layers;

(2) forming layers of several materials including copper and an organic solderable protectant (OSP) to develop a ball attach area on the ball attach side, wherein said OSP layer is the outer surface layer, and wherein step (1) occurs before step (2); and (3) applying a photo imagible solder mask on the wire bond and ball attach sides.

6. A method of claim 5, further comprising the steps of:

(4) drilling at least one via hole through said laminate; and (5) plugging said at least one via hole with a thermo-curable ink.

7. A method of claim 6, wherein step (5) occurs before step (1).

8. A method of claim 5, wherein said step (1) further comprises the step of etching circuitry on the wire bond side by using an acidic cupric etchant.

9. A semiconductor package, comprising a substrate having at least one via hole drilled through said substrate;

a first side having a wire bond area, said wire bond area having circuitry etched in a copper layer, said copper layer being formed over a laminate representing the base of the semiconductor package and the top and side surfaces of said copper layer being fully covered by one or more metallization layers;

a second side having a ball attach area, said ball attach area having layers of several metals including copper and gold, wherein said gold layer is the outer surface layer; and a solder mask deposited on said first and second sides.

10. A semiconductor package, comprising a substrate having at least one via hole drilled through said substrate;

a first side having a wire bond area, said wire bond area having circuitry etched in a copper layer, said copper layer being formed directly over a laminate representing the base of the semiconductor package and the top and side surfaces of said copper layer being fully covered by layers of several metals including gold;

a second side having a ball attach area, said ball attach area having layers of several materials including copper and an organic solderable protectant (OSP), wherein said OSP layer is the outer surface layer; and a solder mask deposited on said first and second sides.

* * * * *